United States Patent
Lens-Rosal

(10) Patent No.: US 11,073,865 B1
(45) Date of Patent: Jul. 27, 2021

(54) APPARATUSES AND METHODS FOR ERGONOMICALLY HOLDING HANDHELD ELECTRONICS

(71) Applicant: Jonathan Lens-Rosal, Hanover, MD (US)

(72) Inventor: Jonathan Lens-Rosal, Hanover, MD (US)

( * ) Notice: Subject to any disclaimer, the term of this patent is extended or adjusted under 35 U.S.C. 154(b) by 177 days.

(21) Appl. No.: 16/273,759

(22) Filed: Feb. 12, 2019

Related U.S. Application Data

(60) Provisional application No. 62/629,277, filed on Feb. 12, 2018.

(51) Int. Cl.
| | |
|---|---|
| *H02J 7/00* | (2006.01) |
| *G06F 1/16* | (2006.01) |
| *A45F 5/10* | (2006.01) |
| *H05K 5/02* | (2006.01) |
| *H02J 7/34* | (2006.01) |

(52) U.S. Cl.
CPC .............. *G06F 1/1628* (2013.01); *A45F 5/10* (2013.01); *G06F 1/1613* (2013.01); *H02J 7/0044* (2013.01); *H02J 7/342* (2020.01); *H05K 5/023* (2013.01); *H05K 5/0234* (2013.01); *A45F 2200/0525* (2013.01)

(58) Field of Classification Search
CPC ... G06F 1/1628; G06F 1/1613; H05K 5/0234; H05K 5/023; H02J 7/0044; H02J 7/342; A45F 5/10; A45F 2200/0525
USPC .......................................... 320/103, 113–115
See application file for complete search history.

(56) References Cited

U.S. PATENT DOCUMENTS

| | | |
|---|---|---|
| D704,713 S | 5/2014 | Liniger |
| 9,541,233 B2 | 1/2017 | Papania et al. |
| 2014/0028243 A1* | 1/2014 | Rayner ................ H04B 1/3888 320/103 |
| 2014/0191724 A1* | 7/2014 | Wojcik ................ H04M 1/7246 320/114 |

(Continued)

*Primary Examiner* — Zixuan Zhou
(74) *Attorney, Agent, or Firm* — Law Office of Michael Antone, LLC; Michael Antone

(57) ABSTRACT

Apparatuses and methods of the present invention improve the ease of use characteristics of handheld computer, such as a tablet, by providing a handheld apparatus that may be married with the computer to enable the computer to be held in an ergonomic position for use. The apparatus may include a base, an electronic retaining portion (ERP) and a contoured handle having a gripping plane that is substantially parallel to a tablet retention plane of the electronic retaining portion in which the computer is retained with its screen in the tablet retention plane. In various embodiments, the apparatus may include the ERP having a tablet retention plane and a contoured handle cooperating with the ERP, the contoured handle having a shape defining a gripping plane substantially parallel to the tablet retention plane, where the ERP is rotatable relative to the handle. The apparatus may be further configured to provide an office and "on-the-go" experience by cooperating with a functionality expandability station that provides access to multiple peripherals such as a keyboard, multi-monitors, USB ports, speakers ports, batteries or other energy sources and re-chargeability of an on-the-go handheld power source, thereby enabling a desktop/laptop main computer experience.

20 Claims, 22 Drawing Sheets

(56) References Cited

U.S. PATENT DOCUMENTS

| | | | |
|---|---|---|---|
| 2014/0287801 A1* | 9/2014 | Ho | H04B 1/3888 |
| | | | 455/573 |
| 2015/0001122 A1 | 1/2015 | Jarke | |
| 2015/0009672 A1* | 1/2015 | Girault | A45F 5/00 |
| | | | 362/253 |
| 2015/0163936 A1* | 6/2015 | Le Gette | F16M 13/04 |
| | | | 206/45.2 |
| 2015/0169000 A1 | 6/2015 | Papania | |
| 2015/0182197 A1* | 7/2015 | Willems | A61B 8/462 |
| | | | 600/443 |
| 2016/0161989 A1 | 6/2016 | Prejer et al. | |
| 2016/0215926 A1* | 7/2016 | Pollex | G06F 1/1626 |
| 2017/0079416 A1 | 3/2017 | Mick et al. | |
| 2017/0115692 A1 | 4/2017 | Papania | |
| 2019/0317564 A1* | 10/2019 | Hamann | G06F 1/1632 |

* cited by examiner

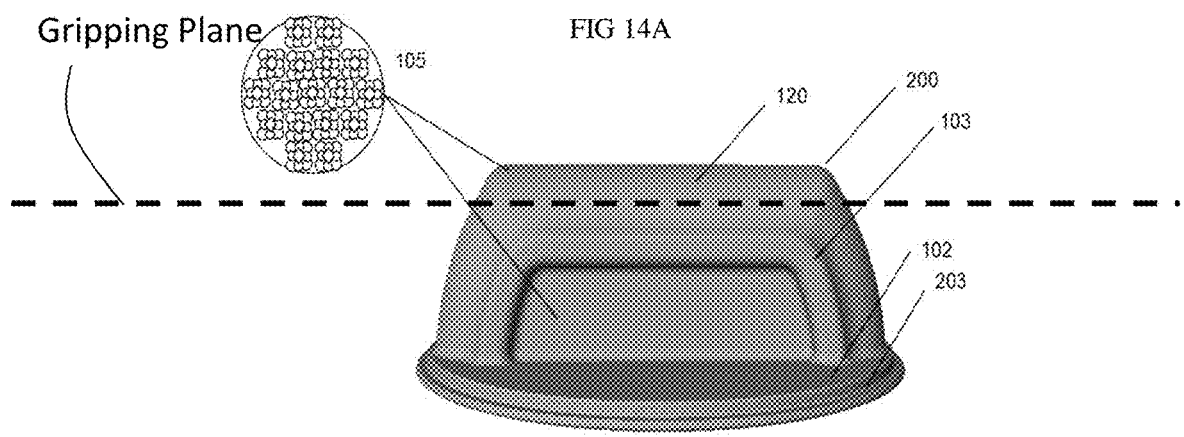
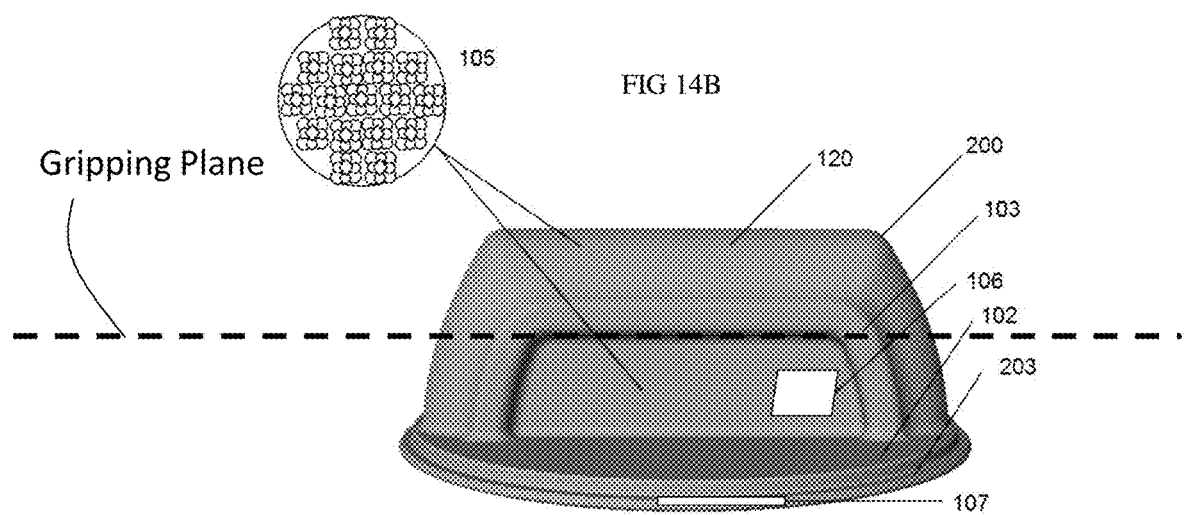

APPARATUSES AND METHODS FOR ERGONOMICALLY HOLDING HANDHELD ELECTRONICS

CROSS-REFERENCE TO RELATED APPLICATIONS

This non-provisional patent application claims the benefit of and priority to U.S. Provisional Patent Application No. 62/629,277 filed Feb. 12, 2018, which is incorporated herein by reference in its entirety.

BACKGROUND OF THE INVENTION

Field of the Invention

The present invention relates in general to hand held electronics, and, more specifically to ergonomic apparatuses and methods for holding handheld computers, such as tablets.

Background Art

Handheld computers, and specifically tablet computers, have greatly improved the mobility and utility of computers. However, the size and smooth back surface and physical configuration of the handheld computers often makes it difficult for the user to handle the computer with one hand while attempting to use it with the other. For example, the high demands of society, such as those who are "on-the-go", in diverse work and leisure environments (office, warehouse's, doctor's office, hospital, educational institutions, restaurants, outdoors), etc., for computers providing broad functionality, flexibility and mobility has grown exponentially over time.

Functionality-wise, many tablet computers have emerged as the computer of choice for mobile purposes as they merge features of a laptop computer with those of a smartphone. Tablets support many functions, such as displaying static and dynamic images, accessing the internet, gaming, reading educational papers/news/email, performing work related activities, aiding presenters and for many other functions and activities.

Unfortunately, utilizing tablets out of the manufacture box is not optimal or user friendly. Once the tablet is in use, the user encounters multiple operational and functionality expansions barriers caused by the inherent physical differences from it is predecessors, i.e., desk and lap top computers. Moreover, most tablets in the market exhibit the same operational and functionality expansions hurdles such as; one hand manipulation awkwardness, transferability clumsiness between user, adaptability to the constant changing user environment, portability, storage, lack of fall protection, data entry difficulty from fear of dropping the tablet while holding it with one hand or cradled on an arm, limited energy source capacity, limited storage capacity, and functionality expandability into a complete working tool for any environment.

Another operational and functionality hurdles, the tablet does not provide a suitable user view angle when placed on the surface of a table/desk/lap. The view angle provided once placed on a table/desk/lap inhibit the user of an ergonomic sit-down posture and hand operational motion that may result in or aggravate orthopedic problems, such as carpal tunnel and accentuating arthritis pain. In addition, tablets generally lack the capabilities of desk and lap top computers to expand the view screen, provide keyboard access, USB ports, speakers' ports, energy source, storage capacity, etc. Therefore, a user finds him/her self-rotating from one machine to another as the user changes environment.

Because users of tablets come from every corner of the social spectrum, a wide range of demands are placed on tablets by users. Various solutions have been proposed to improve the ease of use characteristics with varying degrees of success. For example, see US Patent Publication No. 20160215926A1. However, these prior art attempts still leave much room for improvement in the handling of handheld computers. As such, there is a continuing need for apparatuses and methods that improve the ease of use of handheld computers and tablet computers in particular.

BRIEF SUMMARY OF THE INVENTION

Accordingly, apparatus and methods of the present invention improve the ease of use characteristics of handheld computer by providing a handheld apparatus that may be married with a tablet to promote the "on-the-go" environment. The apparatus may include a base, an electronics retaining portion (ERP) providing transportability, rechargeability, storage, hot-swap and tablet user sharing and an ergonomic contoured handle to provide a power grip-hand position providing comfort, confidence and longevity in the enjoyment of any activity. The contoured handle may have a shape that defines a gripping plane substantially parallel to a retention plane in the ERP where an electronic device having a screen is retained with the screen in the tablet retention plane, such that the electronic device being supported by the apparatus seats comfortable in the user's hand with the screen facing the user.

The handheld apparatus may also be capable of partial or full rotation (360 degrees). 90 degrees user position indicators may be integrated to avoid screen lockup by excess rotation and to take full advantage of the ever-changing motion rotational screen positions as the user changes from horizontal to vertical view.

Furthermore, various other features may be included, such as textured surfaces on the contoured handle to enhance user holding confidence experience, a standalone position feature for when placed on a flat surface, wall-mount systems (mechanical, magnetic, suction, etc.), and an embedded wired or wireless rechargeable power source. The embedded rechargeable energy source may further be capable of recharging mobile phones, tablets, and any other apparatus that requires power within the design specifications of the apparatus. Moreover, the handheld system may include an embedded self-check to monitor the battery health of the tablet and its own to avoid overload and to extend power source life cycle. The ERP may be a snap-on onto the protecting cover to provide protection from the environment, user careless behavior and low altitude falls such as from your lap or dinner table.

In various embodiments, the apparatus may be coupled, wirelessly and/or wired, to a functionality expandability station that provides access to multiple peripherals such as a keyboard, one or more monitors, USB ports, speakers ports, energy source and re-chargeability of an "on the go" handheld power source. In this manner, the users can exchange environment seamlessly and be equipped to perform tasks as well as if it had a laptop at their desk or being "on the go". In addition, the functionality, expandability station may be used to recharge an embedded rechargeable energy sources and/or the tablet and may provide light aesthetics/enhancement, longevity, mobility and adaptability to a tripod base and adaptable to be utilized by the law enforcement or first responders within their vehicles.

As may be disclosed, taught, and/or suggested herein to the skilled artisan, the present invention addresses the continuing need for hardware and/or software systems, apparatuses, networks, and methods that enable improved ornamental and other applications.

BRIEF DESCRIPTION OF THE DRAWINGS

The accompanying drawings are included for the purpose of exemplary illustration of various aspects of the present invention to aid in description, and not for purposes of limiting the invention and may not necessarily be to scale.

FIGS. 14A and 14B illustrate a side view of various base and contoured handle assembly embodiments.

Figure 1A:
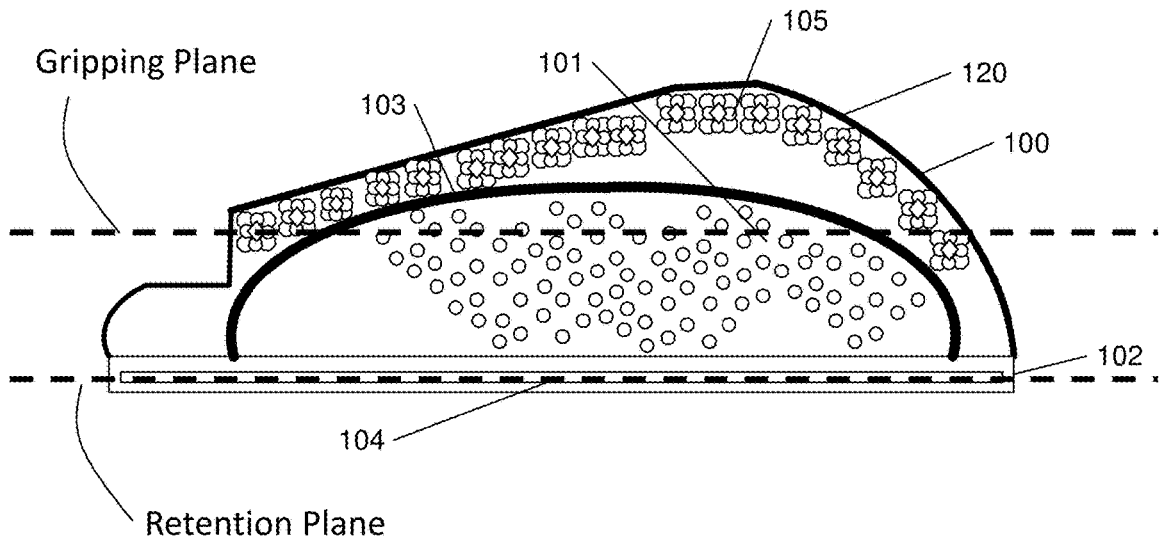
FIG. 1A-1B illustrate a side view of various handheld apparatus embodiments.

In the drawings and detailed description, the same or similar reference numbers may identify the same or similar elements. It will be appreciated that the implementations, features, etc. described with respect to embodiments in specific figures may be implemented with respect to other embodiments in other figures, unless expressly stated, or otherwise not possible.

No claim is made to any images, names, or any other intellectual property of others that may be depicted in the specification and drawings, and all intellectual property rights owned by others remain with the property of those others. Any use of others' intellectual property herein is meant to be only exemplary in nature to aid in describing the invention and not meant to suggest or claim any ownership in, or right to, their intellectual property.

DETAILED DESCRIPTION OF THE INVENTION

Apparatuses and methods of the present invention are described herein, by way of example and otherwise. Exemplary embodiments are provided to assist with the explanation and practice of the invention and not to limit the scope of the invention.

Figure 1B:
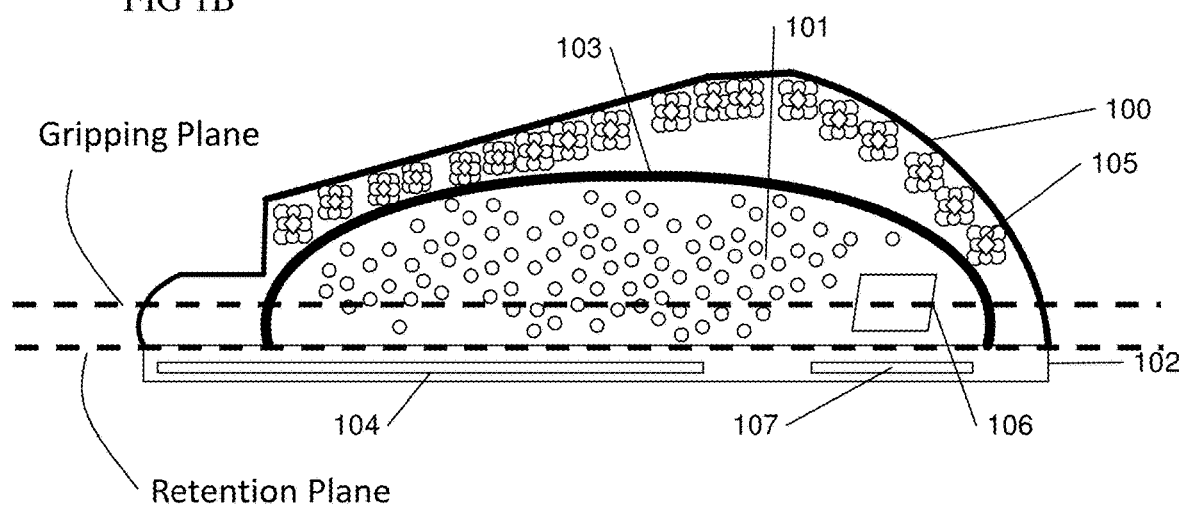
Figure 2:
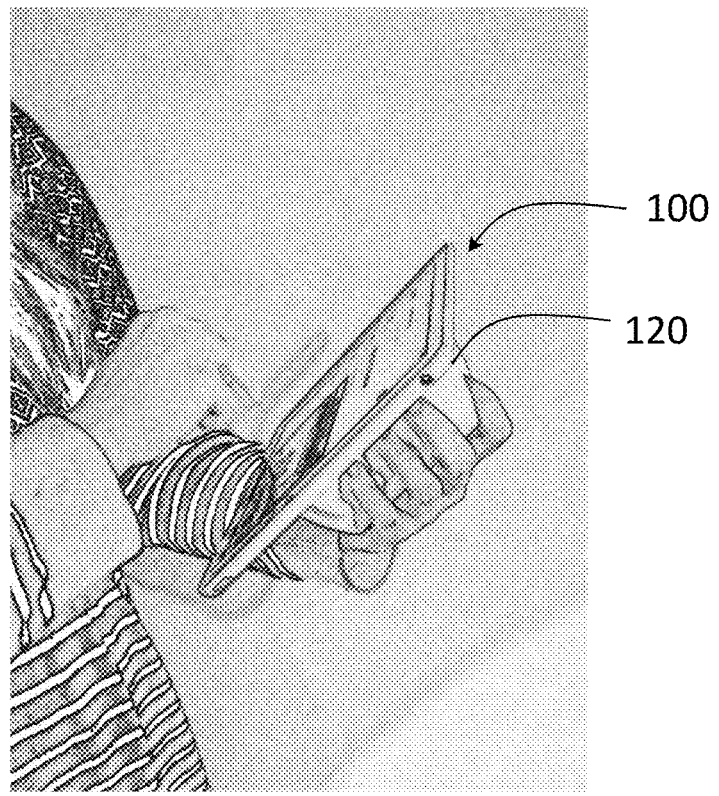
FIGS. 2-10 shows an exemplary embodiment of apparatuses of the present invention in use from various angles.
Figure 3:
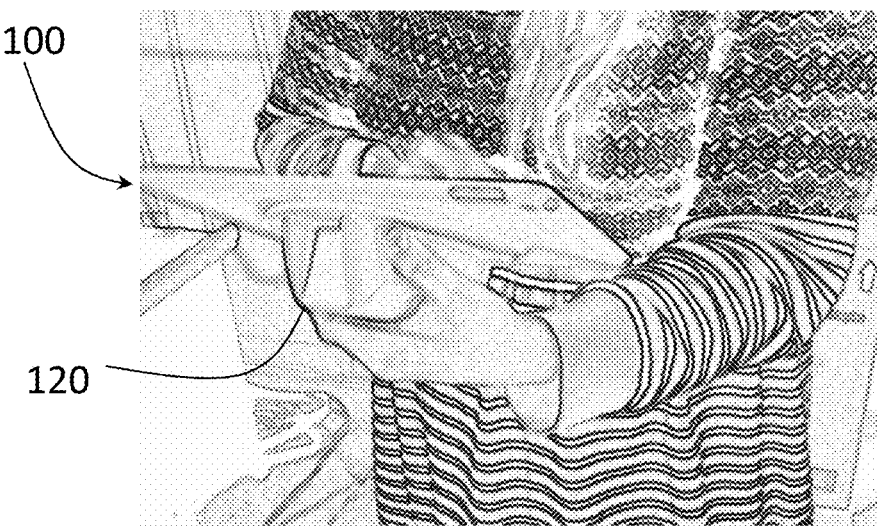
Figure 4:
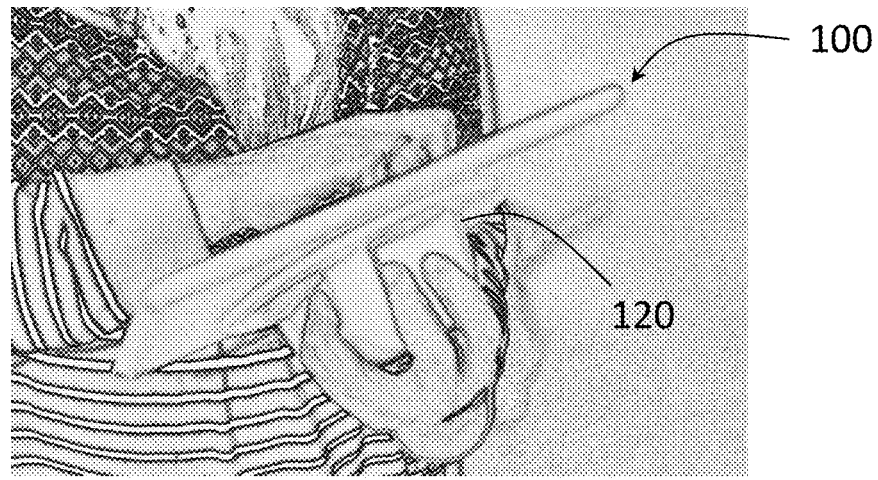
Figure 5:
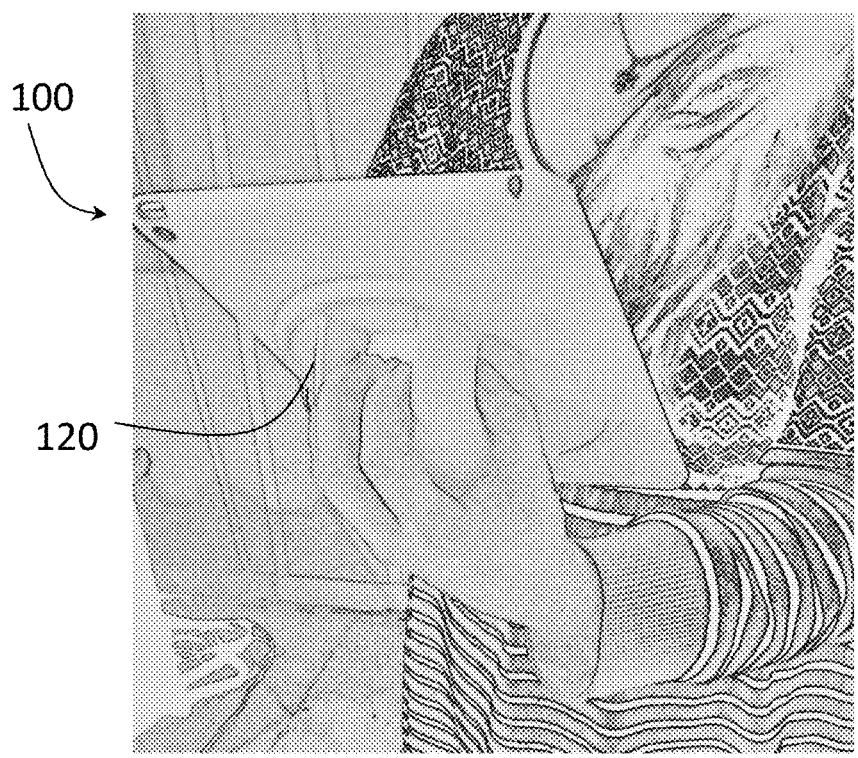
Figure 6:
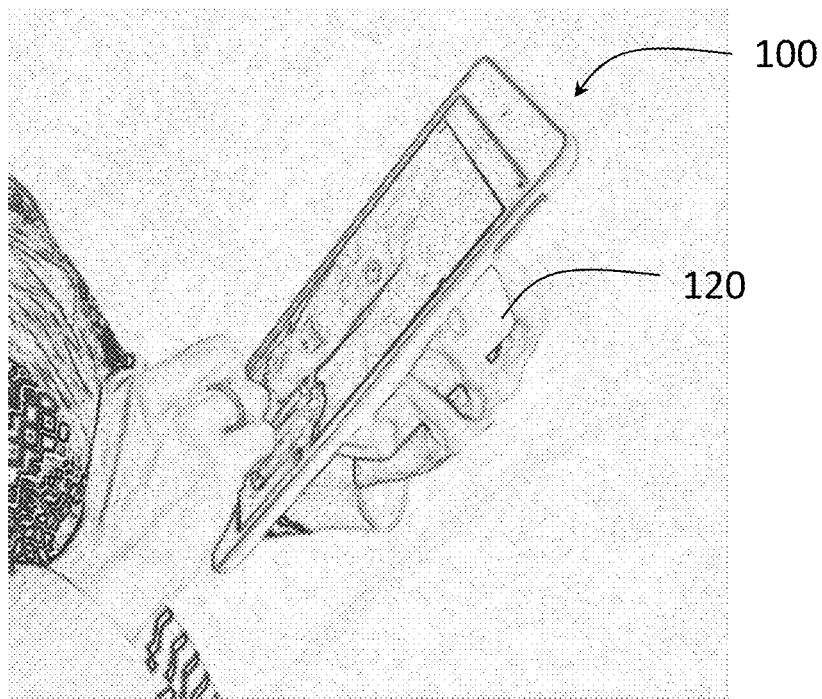
Figure 7:
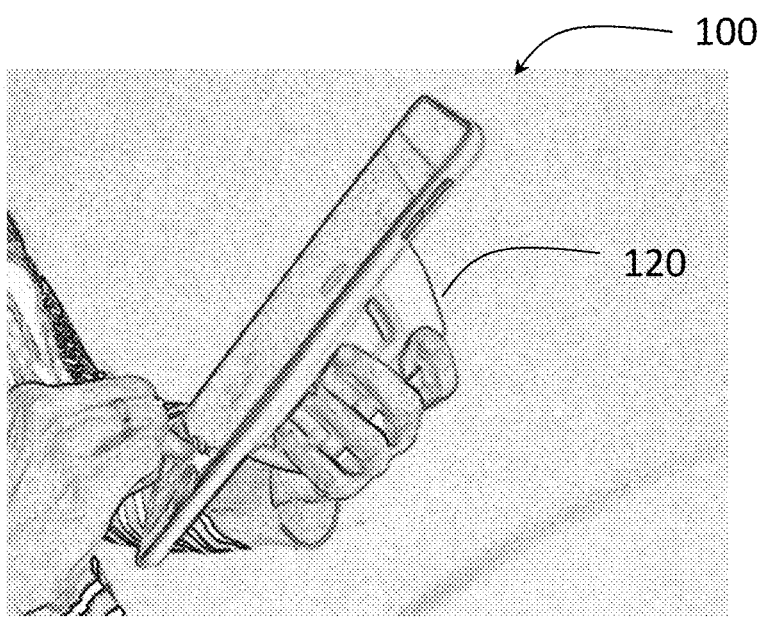
Figure 8:
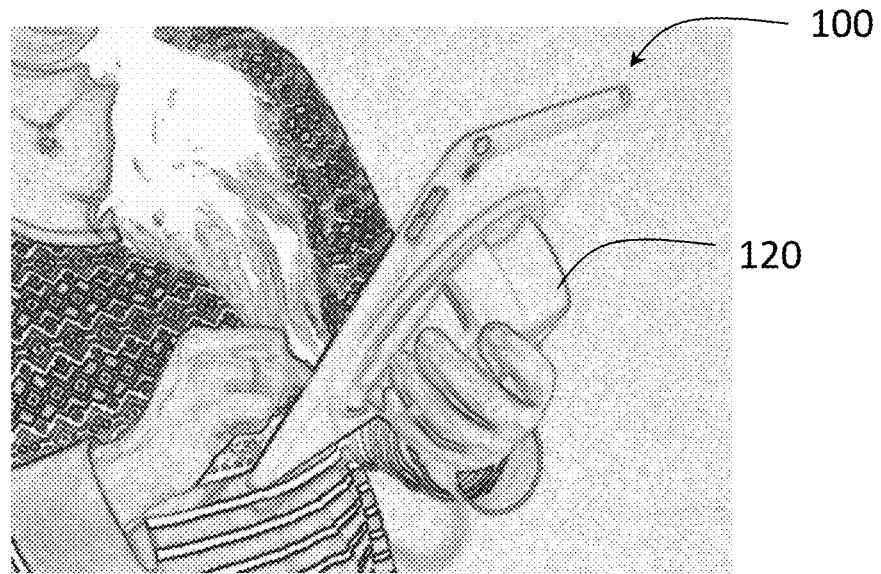
Figure 9:
Figure 10:
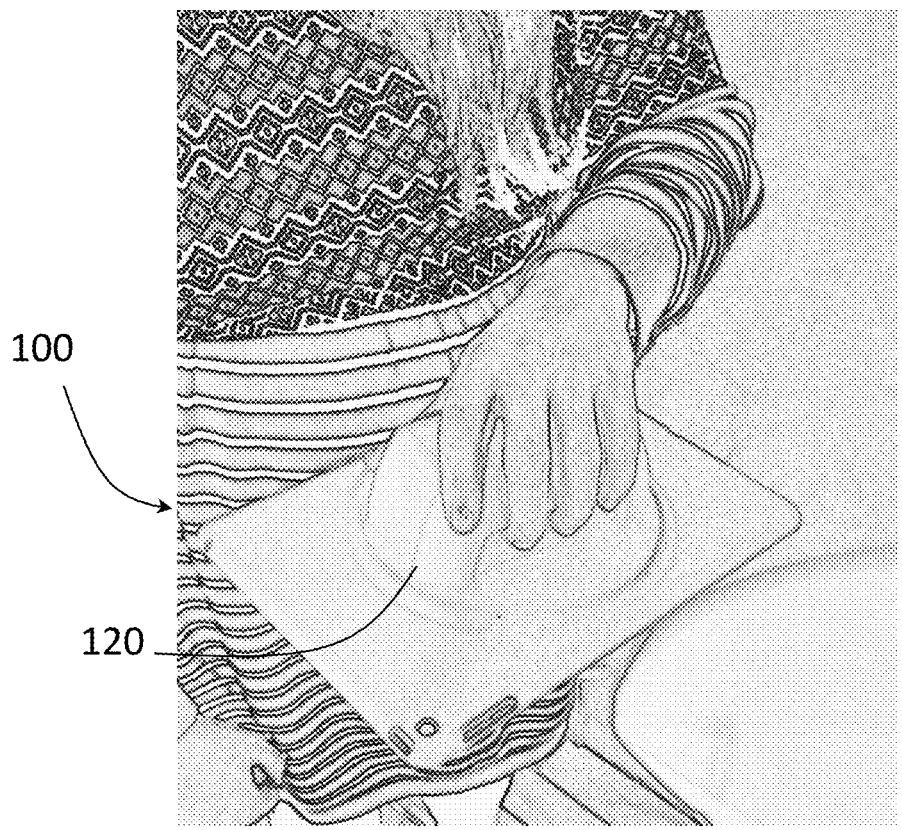

FIG. 1A-B illustrate side views of handheld apparatus 100 embodiments of the present invention. The apparatus 100 may be used to with a handheld computer, such may be a tablet computer or another handheld electronic device, all of which will be referred to herein for convenience as a "tablet". While the invention may generally be applicable to handheld mobile phones and other electronics of similar size or smaller, it will be appreciated that many mobile phones and other small handheld electronics that are designed to be held within one hand, so may not encounter some of the usability challenges of tablets and other devices that are not designed to be held within one hand.

The apparatus 100 may include an ergonomic contoured handle 120 that may be used by a user to hold the apparatus 100 retaining the tablet, as well as to provide a stand or support, when the apparatus 100 is placed in a free-standing position on a surface. The contoured handle 120 may have a shape that defines a gripping plane that is substantially parallel to a retention plane of the electronics retaining portion in which the tablet is retained, such that the apparatus 100 seats comfortably in the user's hand and the tablet screen faces the user.

When the gripping plane of the contoured handle 120 is substantially parallel to the tablet retention plane of the electronics retaining portion, a user may hold the apparatus 100 generally in a fingertip grip position, as generally shown in FIGS. 2-10. In this position, the screen of the tablet being retained will generally be in the tablet retention plane parallel to the gripping plane and will substantially face the user when the tablet is retained in the electronics retaining portion. In this position, a user may comfortably hold the apparatus in an ergonomic position with their wrist generally straight and elbow bent near 90 degrees with the tablet retained in the apparatus 100 with the screen substantially facing the user. When the user moves the apparatus 100 closer to or further away from their eyes, the user may bend their wrist and elbow joints in a cooperative manner to maintain generally the 90 degree resulting angle and may articulate their arm at the shoulder joint to adjust the position of the tablet at a given distance from their eyes.

The apparatus 100 may include a textured surface to improve a user's grip of the apparatus 100, such as grip dimples patterns 101 and 105 on the contoured handle 120 and/or below the grip edges 103. The grip edge 103 may be provided on both sides of the contoured handle 120 enhancing user comfort, confidence and longevity in the enjoyment of any activity.

The apparatus 100 includes a base 102, which may be a rotating platform capable of partial or full rotation (360 degrees). The base 102 may include an embedded edge 104 to allow the apparatus 100 to be securely engage with a tablet protector cover, or electronics retaining portion (ERP) 201.

As shown in FIG. 1B, various embodiments of the apparatus 100 may include a hideout ledge 107 promoting removability from the ERP. In such embodiments, a rectangular or other release mechanism 106 may be provided on one or more positions on the apparatus 100. By detaching apparatus 100 from the ERP 201, it provides transportability, recharge-ability, storage, Hot-Swap and Tablet sharing capabilities to the user.

Figure 11:
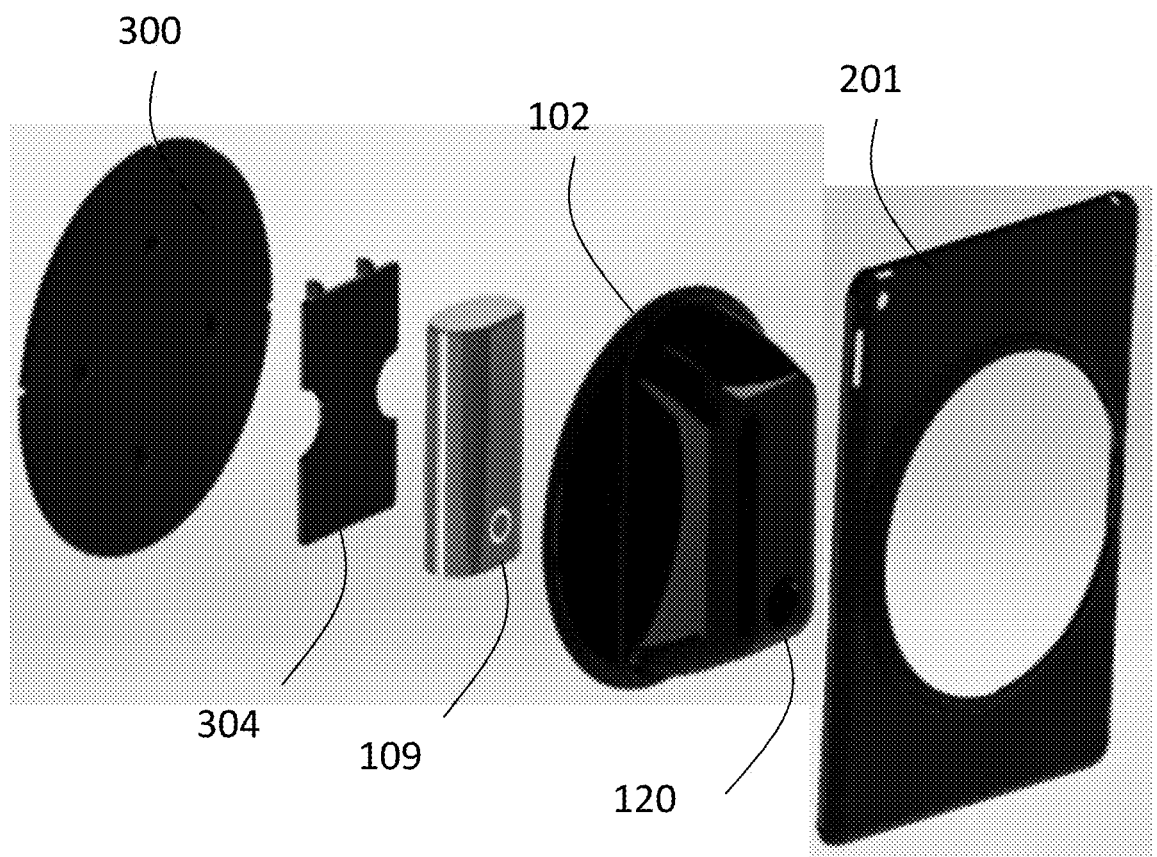
FIG. 11 illustrates an exploded view of various handheld apparatus embodiments.

FIG. 11 shows a partially exploded perspective view of various embodiments of the apparatus 200. The apparatus 200 or 100 may include a rotational lid indicator 300, an electronics backplate (removable or non-removable) 304, electronics module 109 in various combinations with the contoured handle 120, base 102, and ERP 201.

Figure 12A:
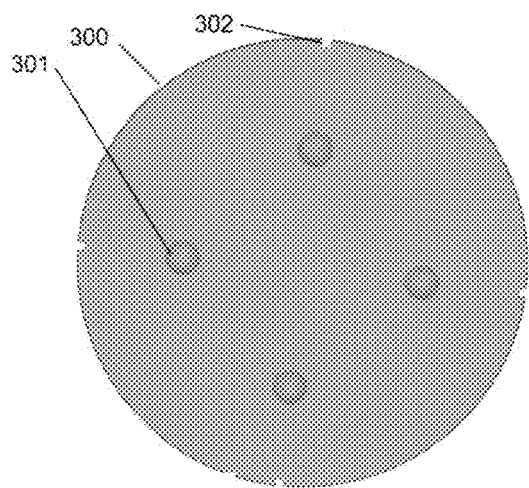
FIG. 12A-12C illustrates the top, angle and bottom view of the rotational position indicator lid of various handheld embodiments.
Figure 12B:
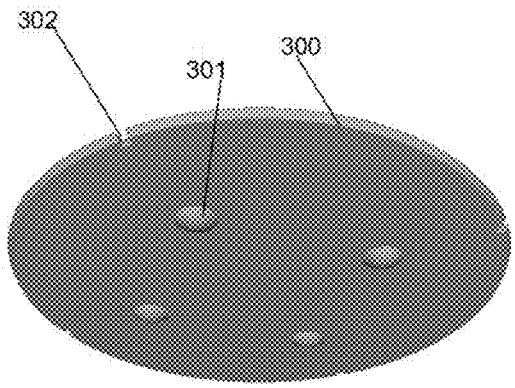
Figure 12C:
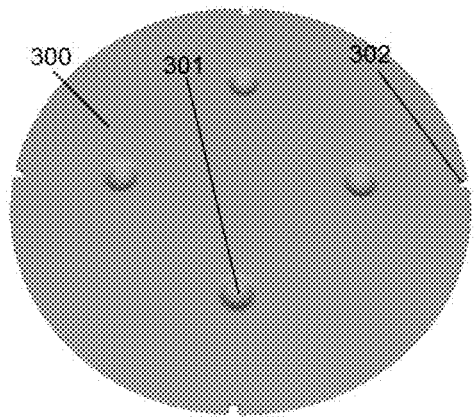

FIG. 12A-C illustrate the top, angle and bottom view of the rotational position indicator lid 300. The rotational position indicator lid 300 may include dimples 301 that may be used to engage with the base 102. For example, the dimples 301 may be ninety degrees from each other and married with the base 102 of FIG. 1A-B. Moreover, the lid 300 may engage the ERP 201 with locking indentations 302. The rotational position indicator lid 300 provides the user with tablet awareness position to avoid screen lockup by excess rotation and to take full advantage of the ever-changing motion rotational screen positions as the user changes from horizontal to vertical view. A retainer wall 211, 209, and 203 may be used to keep the rotational lid indicator 300 in placed.

Figure 13A:
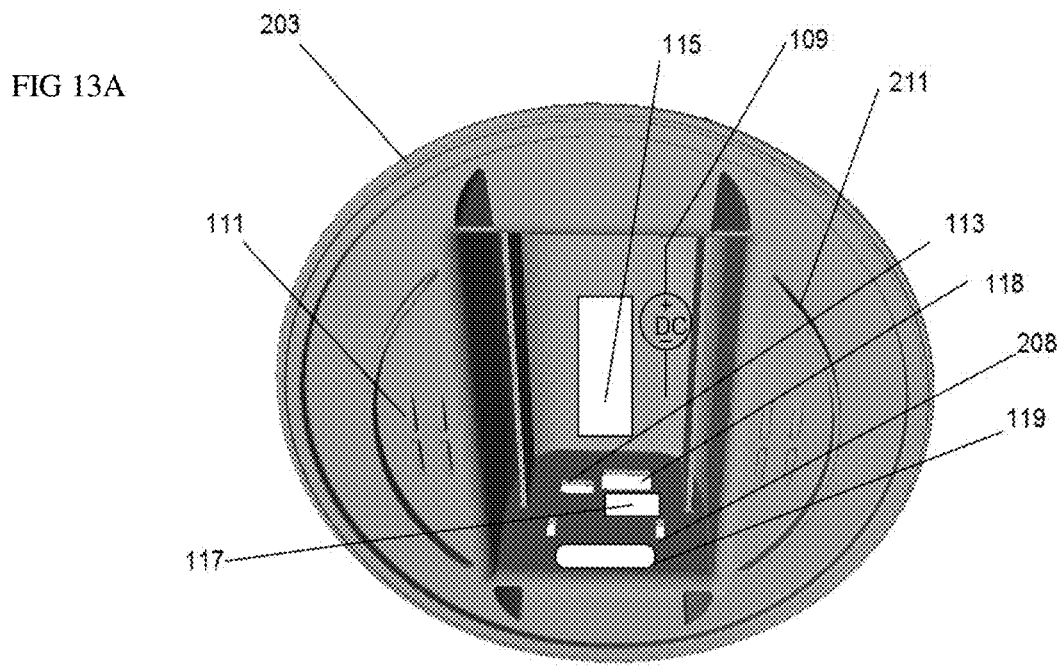
FIG. 13A-13D illustrate underneath various base embodiments.

FIG. 13A illustrates underneath the contoured handle 120 detached from the tablet and ERP 201. The cavity underneath may include a rechargeable power source 109 that may be charged by via power adapter charger to the wall outlet and/or a functionality expansion station that may also be used to power the tablet at the same time or separately. The embedded rechargeable power source 109 may also recharge mobile phones, tablets, and/or any other apparatus that requires similar energy charge. The position indicators 111 will alert the user when a new view angle has been achieved and provides a secure view location angle avoiding screen lockup by excess rotation.

The apparatus 100 or 200 may have various handles 120 or 220 with various openings to expose various functional portions of the tablet that are not on the screen portion, such as charging ports; mobile communication interfaces 119, connectors 117 and 118 and the embedded rechargeable power source 113. A rectangular bar LCD panel 115 indicator may be used to provide the user with real time status and health of tablet and its own power source 109 to avoid overload and to extend power source life cycle of both the tablet and embedded rechargeable power source 109.

The apparatus 100 and 200 may also include one or more functionality expandability station ports 119. The port 119 enable the tablet in the apparatus to be coupled, wirelessly and/or wired, to the functionality expandability station that provides access to multiple peripherals such as a keyboard, one or more monitors, USB ports, speakers ports, energy source and re-chargeability of an "on-the-go" handheld power source. In this manner, the users can exchange environment seamlessly and be equipped to perform tasks as well as if it had a laptop at their desk or being "on-the-go". The functionality, expandability station may be used to recharge an embedded rechargeable energy sources and/or the tablet and may provide light aesthetics/enhancement, longevity, mobility and adaptability to a tripod base and adaptable to be utilized by the law enforcement or first responders within their vehicles.

Figure 13B:
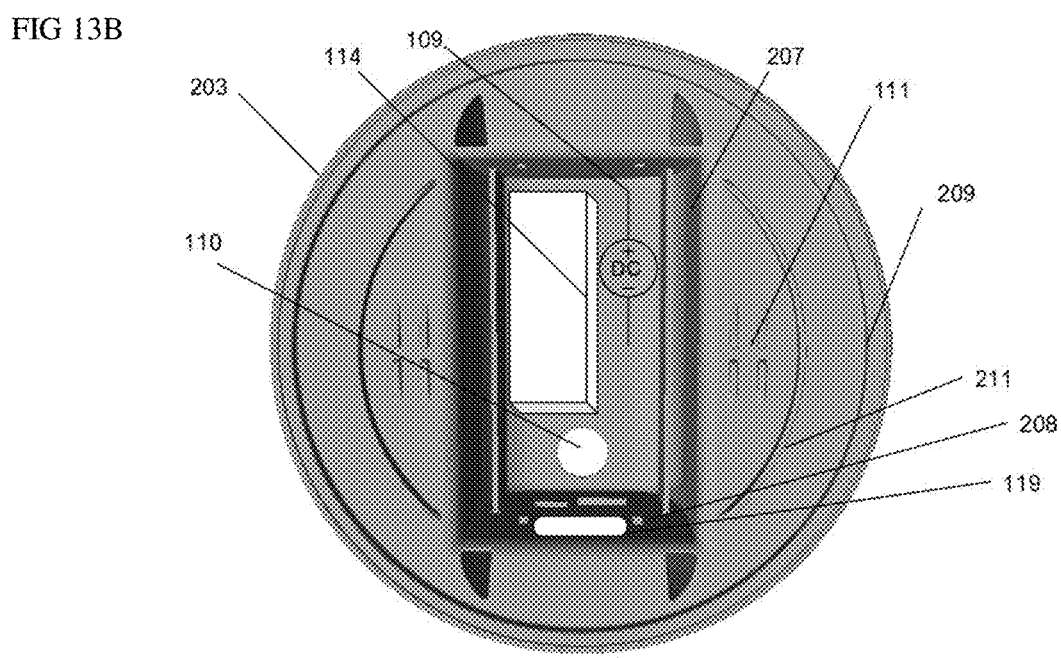

FIG. 13B illustrate embodiments, the electronic module may include storage 114 in the cavity that may be accessed from the functional expandability station port 119 utilizing the tablet. A motion activated LED 110 indicator may be provided in lieu of, or in addition to the rectangular bar LCD panel 115.

Figure 13C:
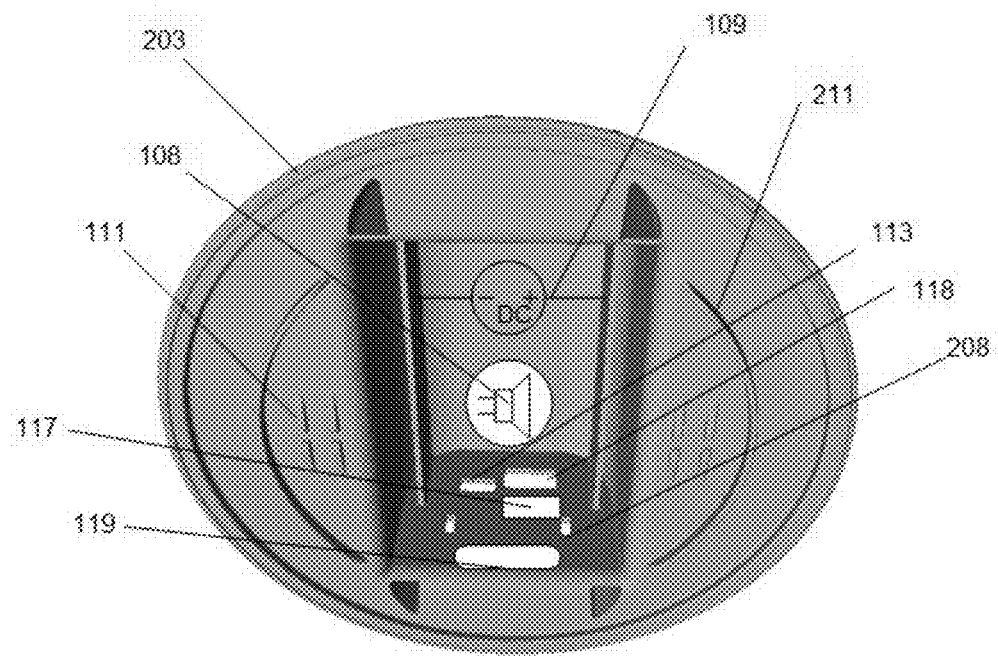

FIG. 13C illustrate embodiments, the apparatus 100 or 200 may include handles 120 or 220 may further include one or more speakers 108 to provide the user with audio playback functionality and audio awareness of the tablet conditions as described.

Figure 13D:
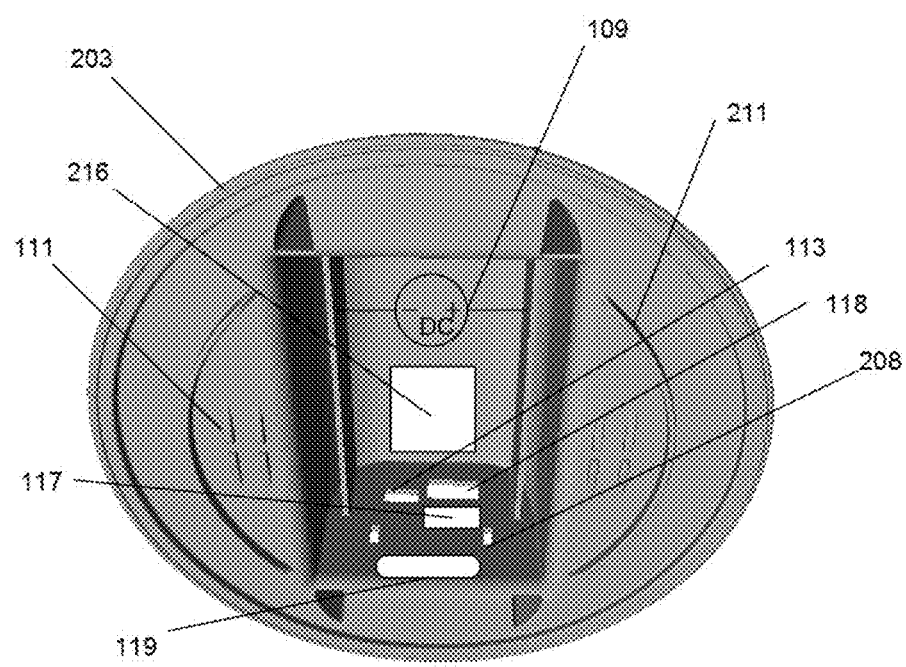

FIG. 13D illustrate other embodiments of the apparatus 100 or 200 with an LCD panel 216 indicator.

FIGS. 14A and 14B illustrate finished side views of assembled contoured handle 120 and base 102 detached from the tablet and ERP 201.

Figure 15A:
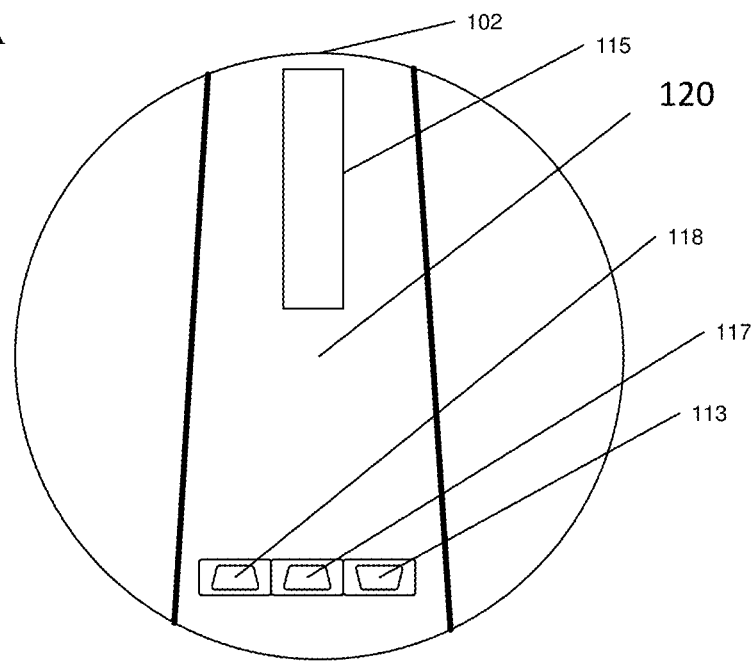
FIG. 15A-15D illustrate aerial views of various base embodiments.
Figure 15B:
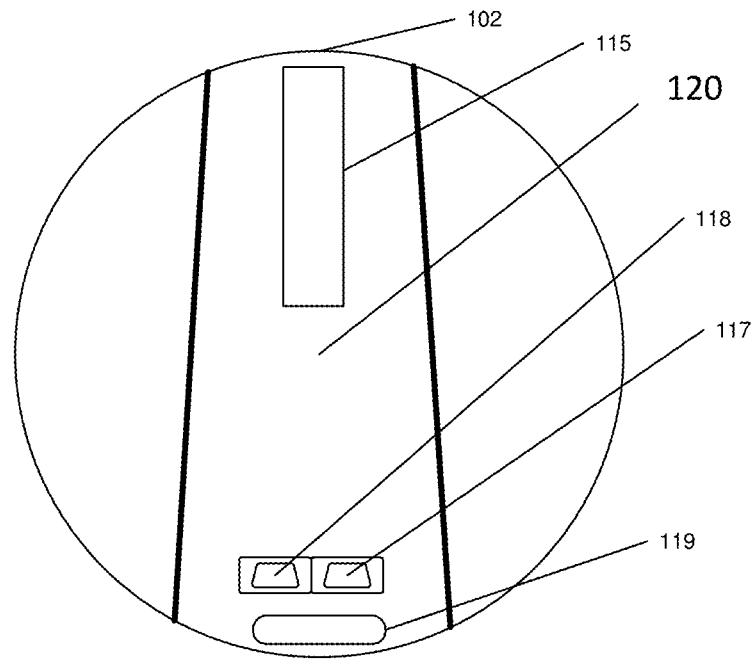

FIG. 15A-B illustrate aerial views of the base 102 detached from the ERP 201. The base 102 include one or more power and/or communication ports 113, 117, and 118, which, for example, may be USB and micro USB ports. In addition, a display panel 115 may be included to provide the user with real time status of the health of tablet and the apparatus 100 to avoid overload and to extend power source life cycle of both the tablet and apparatus 100.

Figure 15C:
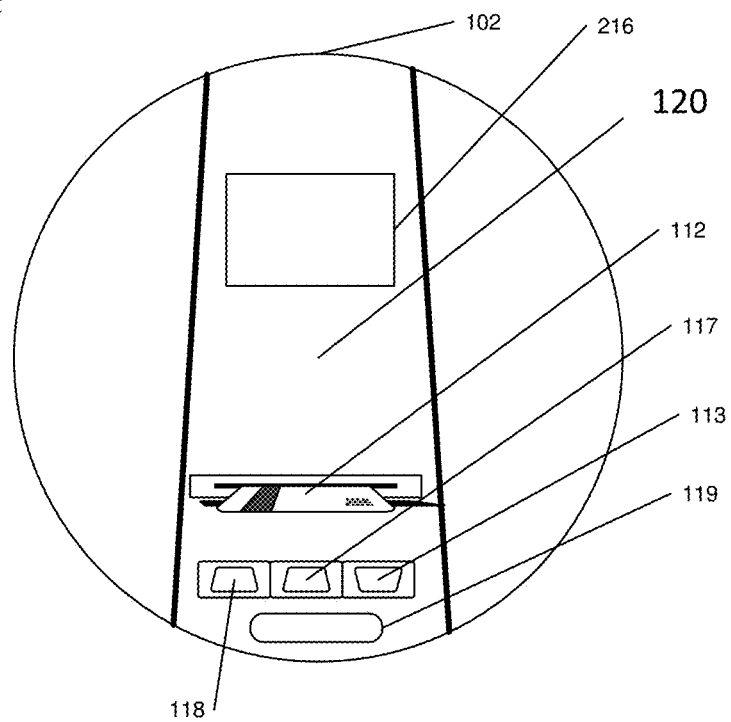
Figure 15D:
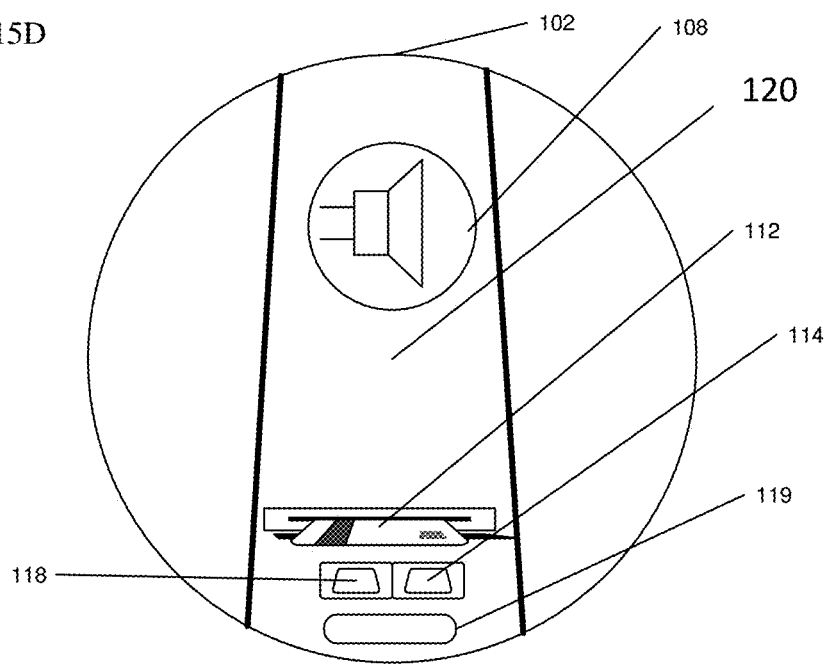

Various other functionality may be added to the apparatus 100 or 200 including functional expandability station ports 119 (FIG. 15B), smart card readers 112 (FIG. 15C), speakers 108 (FIG. 15D) as further described herein.

Figure 16A:
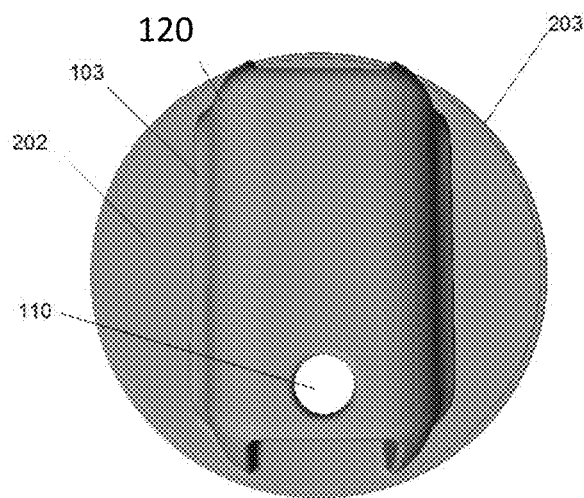
FIG. 16A-16B illustrate aerial views of various handheld apparatus assembly embodiments.
Figure 16B:
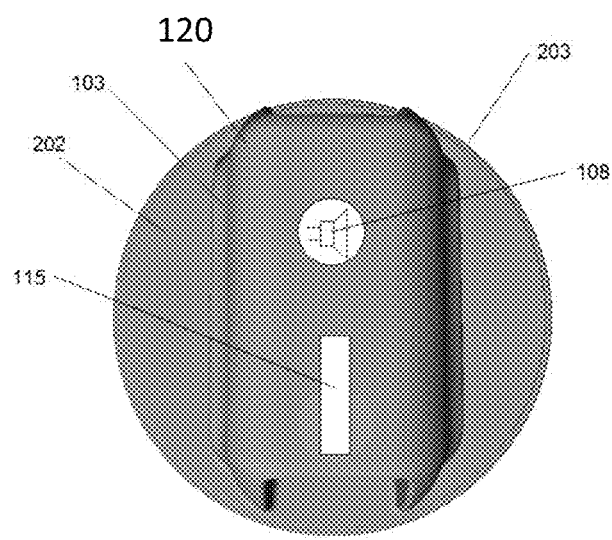

FIG. 16A-B illustrates aerial views of the handle 120 detached from the tablet and ERP 201. The handle 120 portrays a motion activated LED 110 (FIG. 16A) indicator and rectangular LCD bar panel 115 (FIG. 16B) indicator. Both indicators will provide the user with real time status of the health of tablet and its own power source 109 to avoid overload with the objective of extending the power source 109 life cycle. A speaker 108 indicator will provide the user with audio awareness of power source level such as Full, Med, and Empty and health awareness of tablet.

Figure 17A:
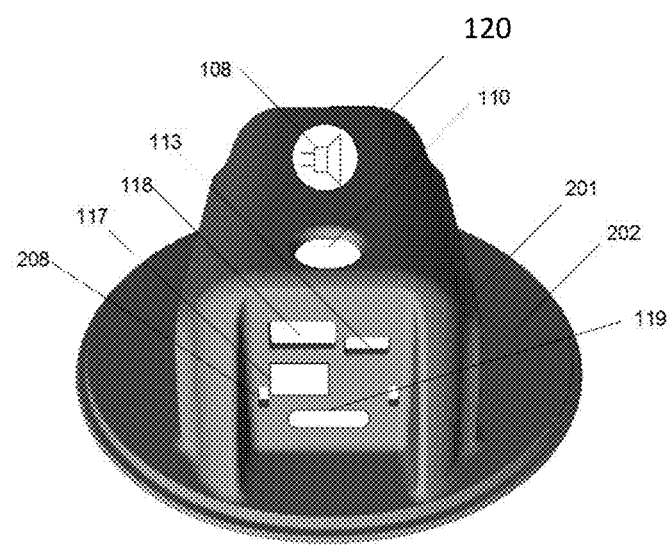
FIG. 17A-17B illustrate front and back views of various handheld apparatus assembly embodiments.
Figure 17B:
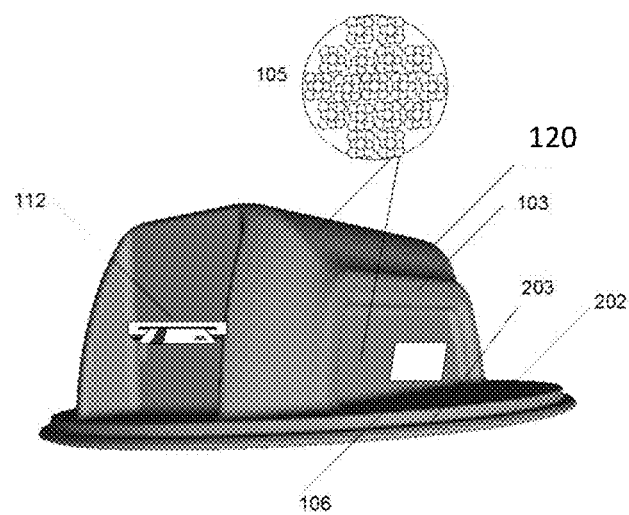

FIG. 17A-B illustrates a back and front view of the handle 120 detached from the tablet and ERP 201. The handle 120 (FIG. 17A) portrays three openings, which may provide access for various functions, such as charging ports; mobile communication interfaces 118, tablet 117, embedded rechargeable USB power source 113, etc. A speaker 108 indicator will provide the user with audio awareness of power source level such as Full, Med, and Empty and health awareness of tablet and its own power source to avoid overload and to extend power source 109 life cycle. It provides expandability thru the functional expandability station port 119 and Confidentiality, Integrity and Availability (CIA) assurance thru the smart card reader 112.

Figure 18A:
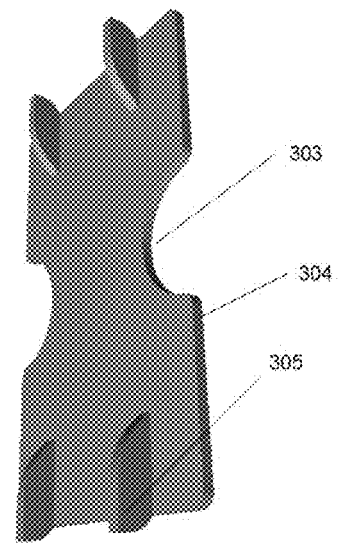
FIG. 18A-18B illustrate multiple angle views of electronics backplate assembly embodiments.
Figure 18B:
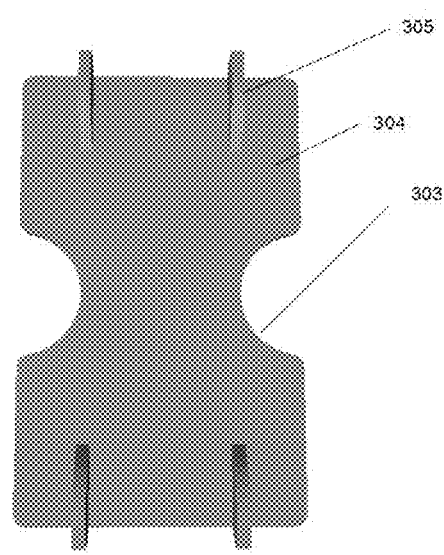
Figure 19A:
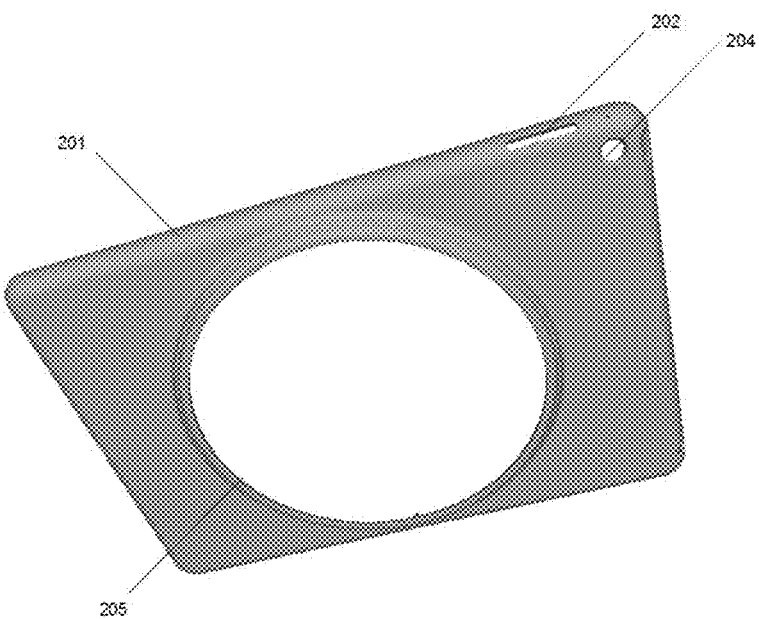
FIG. 19A-19D illustrate multiple angle views of the ERP holder assembly embodiments.
Figure 19B:
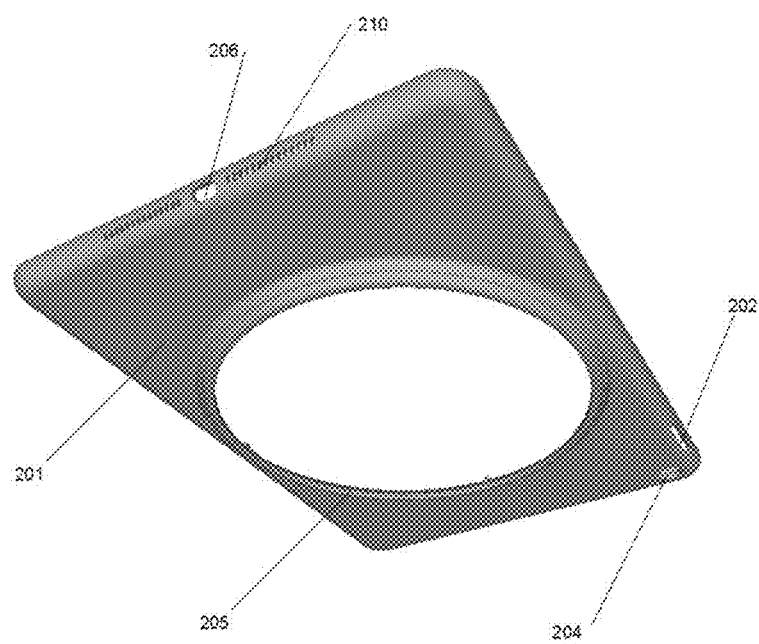
Figure 19C:
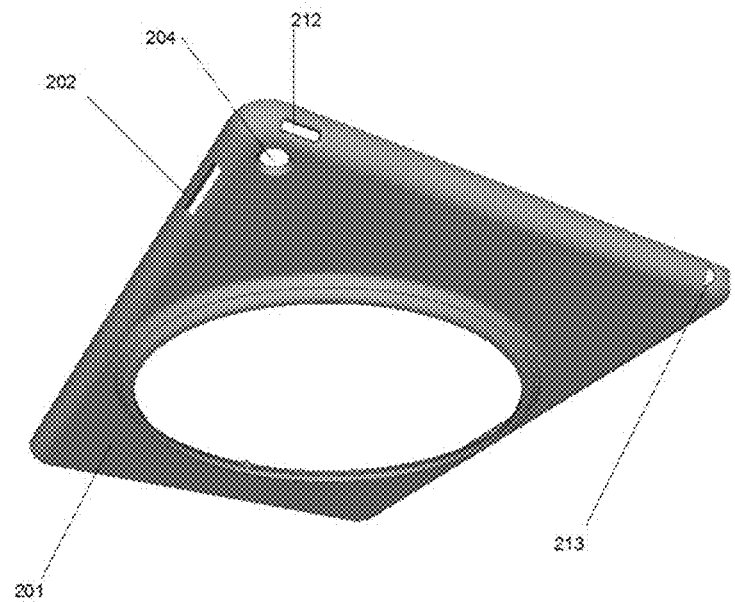
Figure 19D:
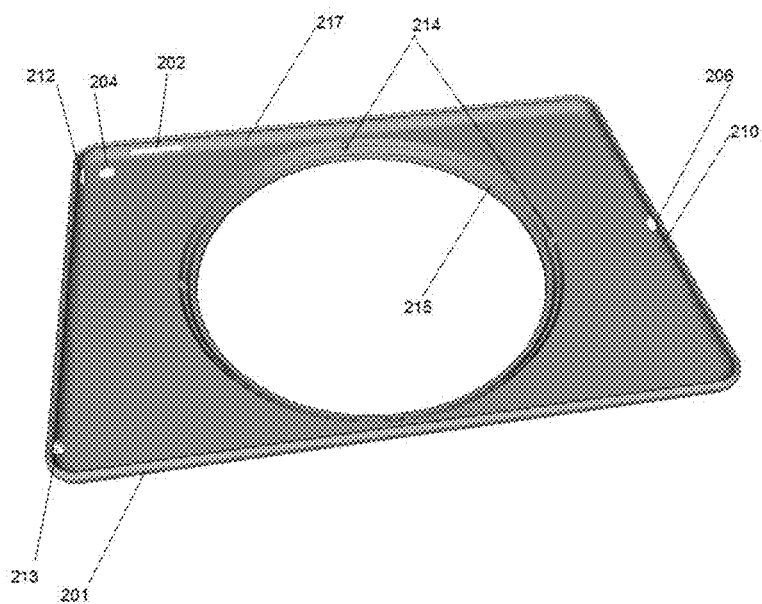

FIGS. 18A-B illustrate multiple angle views of the non-removable electronics backplate 304 detached from the handle portion. The non-removable electronics backplate 304 portrays the finger grip cutout 303 and lock up pin 305.

FIG. 19A-D illustrate multiple angles views, such as back, side and inside, of the ERP 201 and the apparatus 100 or 200 detached from the ERP 201. The ERP 201 (FIGS. 19A, 19B, and 19C) portrays ON/OFF Push Bottom 212, Camera 204, Volume Control 202, Head Phone Jack 213, Tablet Temperature Control Vents 210, Tablet power port 206, and apparatus 100 or 200 rotary base edge 205. The ERP 201 (FIG. 19D) portrays a rotational lid position indicator anchors 214 to aid the rotational lid position lid 300 to be in a permanent position as the user changes angles views, a perpendicular edge to hold and avoid the apparatus 100 or 200 to be detached from the protective case 215, and inside contoured edge 217.

Figure 20:
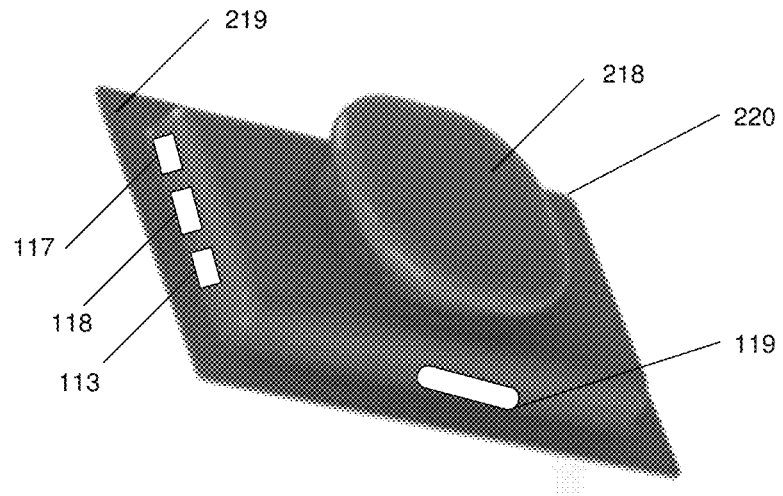
FIG. 20 illustrates side view of various handheld apparatus embodiments.

FIG. 20 illustrates top view of another handle 220 detached from the tablet and ERP 201. FIG. 20 illustrates the handle 220, in which the user can detach to recharge the embedded power source 109 by connecting it to the power adapter charger to the wall outlet or use the wireless charging capability by utilizing the charging pads. Alternatively, one may not detach it and use the functionality expansion station to recharge the embedded rechargeable power source 109 and tablet at the same time or separate. The embedded rechargeable power source 109 can recharge mobile phones, tablets, and/or any other apparatus that requires similar energy charge. It has three openings exposing the following charging ports; mobile communication 118, tablet 117 and the embedded rechargeable power source 113. It provides the user with a functional expandability station port 119. It includes a hand knob grip 218 and handle 220 position lip edge 219.

Figure 21:
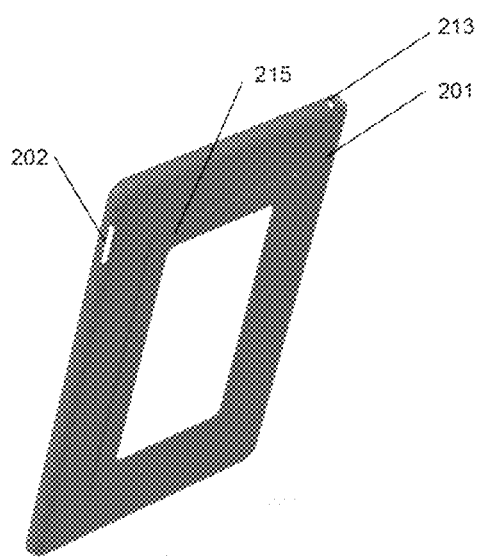
FIG. 21 illustrates an angle view of the ERPs holder assembly embodiments.

FIG. 21 illustrates ERP 201 detached from other parts of the apparatus 100 or 200. The ERP 201 portrays openings for Volume Control 202, Head Phone Jack 213, etc. A perpendicular ledge 215 may be provided to assist with retaining the ERP 201.

Figure 22:
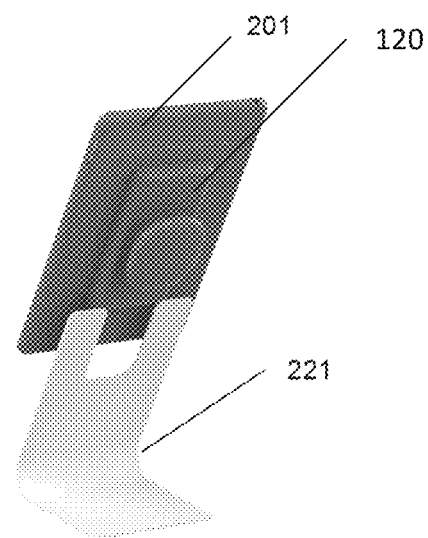
FIG. 22 illustrates a back view of various ERPs and handheld apparatus embodiments and Table Stand Alone Base embodiments.

FIG. 22 illustrates Tablet Stand Alone Base 221 with ERP 201 and apparatus 200 configuration assembled. The Tablet Stand Alone Base 221 portrays the capability to sustain the assembled apparatus 200 and ERP 201 in the horizontal and vertical position for an ergonomic surface enjoyment.

It will be appreciated that various other embodiments of the apparatus 100 and 200 may be employed. For example, the ERP 201 may retain the handheld electronics, e.g., tablet, as a protective cover with a single or multiple piece base and handle portion that are integrated with, attached, or removably connected to the ERP. The base may be attached to the ERP 201 using adhesive or a mechanically fastener and the handle portion may be rotatably connected to the base in various manners, such as with a slip fit, snap-on, etc. In various other embodiments, the ERP may serve as a protective cover with the base and handle portion detached from the ERP.

Figure 23A:
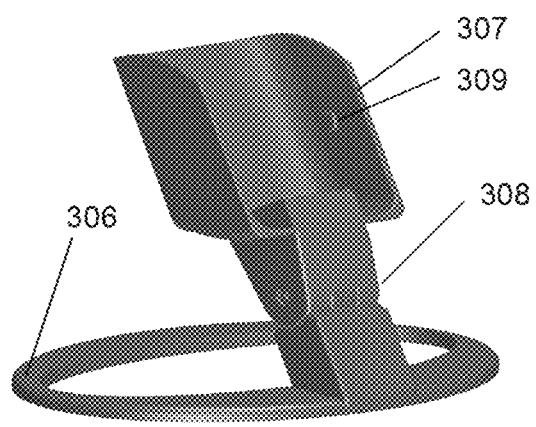
FIG. 23A-23C illustrates front and back view of ERP and handheld embodiments and Table Stand Alone Base embodiment.
Figure 23B:
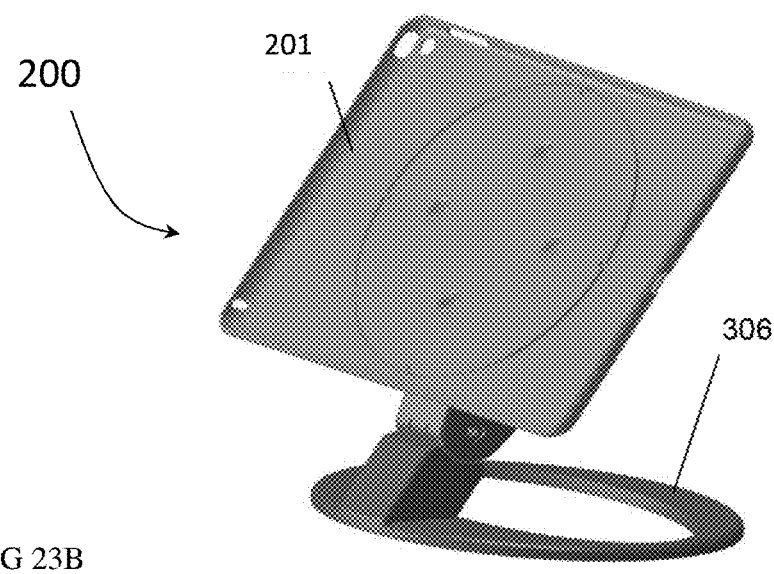
Figure 23C:
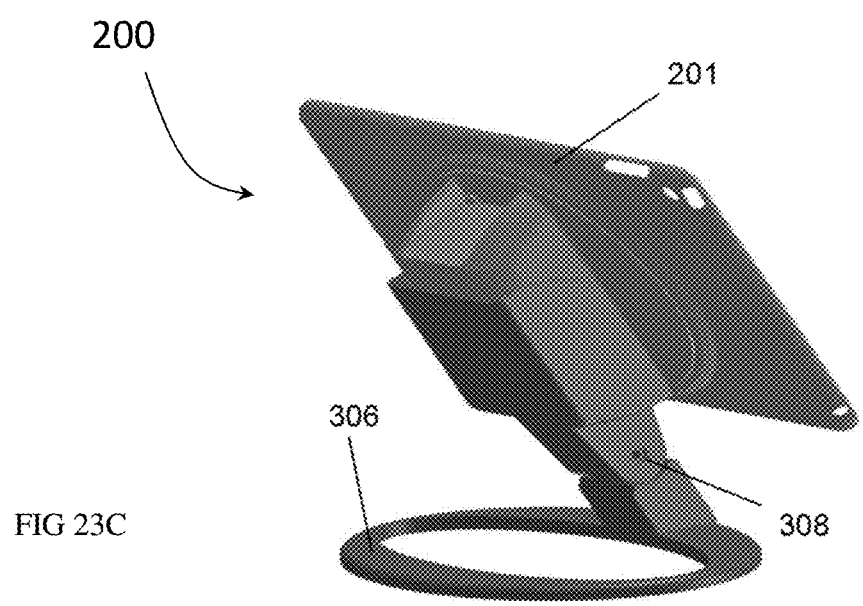

FIG. 23A-C illustrate multiple angles views, such as back, side and inside of a tablet stand-alone base 306. The 306 (FIGS. 23A, 23B, and 23C) portrays an ERP holder 307 capable to securely retain the ERP 201 thru a lock up dot 309 and provide the user with a variable angle adjuster 308. While the base 306 is shown as a single post extending from an oval base portion, one of ordinary skill will appreciate that different number of posts and post designs may be employed with various base portion designs.

Figure 24:
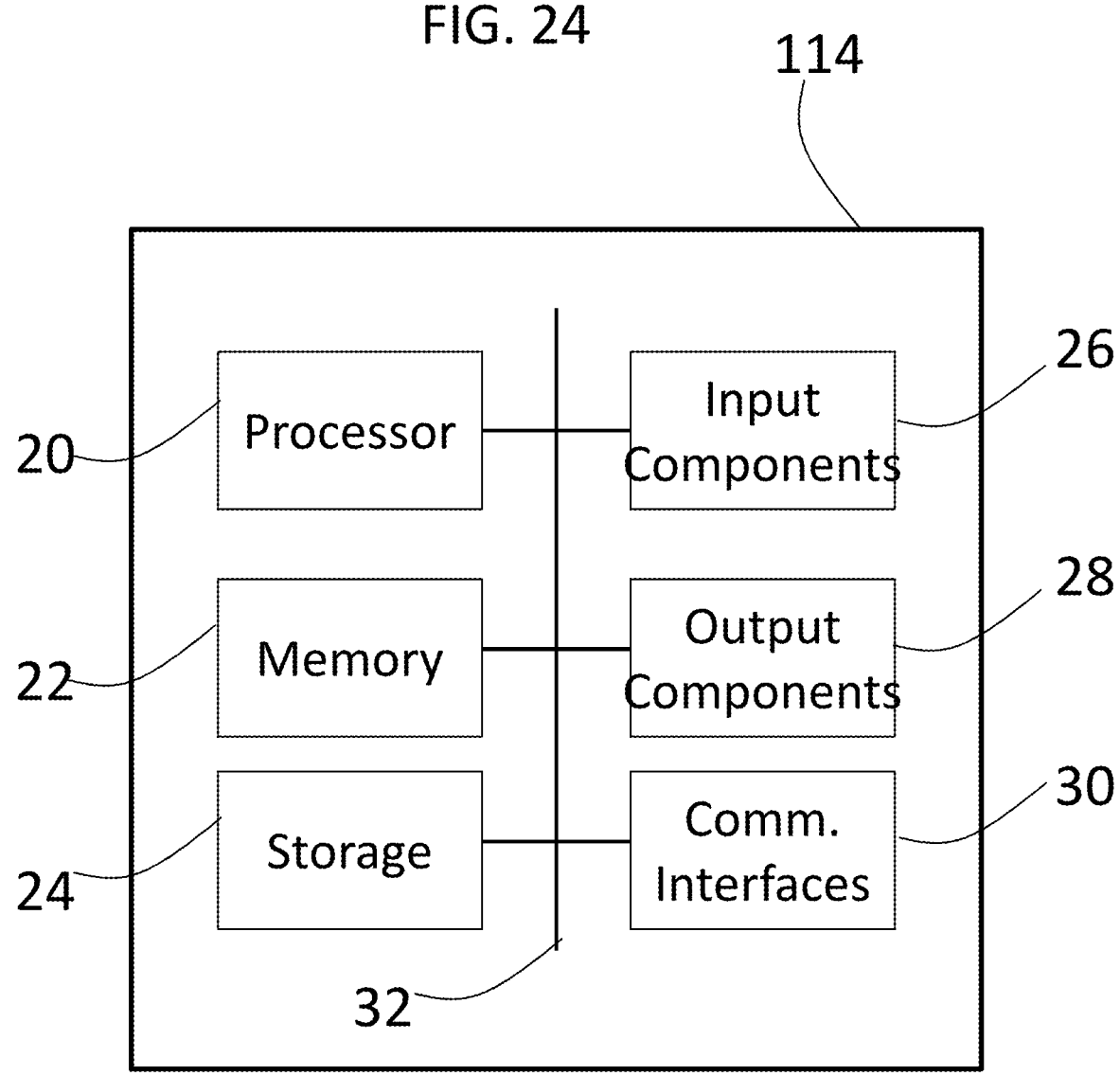
FIG. 24 illustrates the configuration of various computing resources that may be employed in the present invention.

FIG. 24 illustrates exemplary component embodiments that may be employed in various apparatus embodiments 100 or 200 to provide various levels of functionality, which may be generally referred to as "computing resources". The computing resources may each include one or more processors 20, memory 22, storage 24, input components 26, output components 28, communication interfaces 30, as well as other components that may be interconnected as desired by the skilled artisan via one or more buses 32. As previously described, while the components for the apparatus 100 or 200 may often be configured as a single device or multiple devices in close proximity.

Processor(s) 20 may include one or more central processing units (CPU), graphics processing units (GPU), accelerated processing units (APU), microprocessors, and/or any processing components, such as a field-programmable gate arrays (FPGA), application-specific integrated circuits (ASIC), etc.), that interpret and/or execute logical functions. The processors 20 may contain cache memory units for temporary local storage of instructions, data, or computer addresses and may be implemented as a single-chip, multiple chips and/or other electrical components including one or more integrated circuits and printed circuit boards that implements and executes logic in hardware, in addition to executing software.

Processor(s) 20 may connect to other computer systems and/or to telecommunications networks as part of performing one or more steps of one or more processes described or illustrated herein, according to particular needs. Moreover, one or more steps of one or more processes described or illustrated herein may execute solely at the processor 20. In addition, or as an alternative, one or more steps of one or more processes described or illustrated herein for execution in one processor may be executed at multiple CPUs that are local or remote from each other across one or more networks.

The computing resources of the system 100 or 200 may implement processes employing hardware and/or software to provide functionality via hardwired logic or otherwise embodied in circuits, such ads integrated circuits, which may operate in place of or together with software to execute one or more processes or one or more steps of one or more processes described or illustrated herein. Software implementing particular embodiments may be written in any suitable programming language (e.g., procedural, object oriented, etc.) or combination of programming languages, where appropriate.

Memory 22 may include random access memory (RAM), read only memory (ROM), and/or another type of dynamic or static storage apparatus, such as flash, magnetic, and optical memory, etc. that stores information and/or instructions for use by processor 20. The memory 22 may include one or more memory cards that may be loaded on a temporary or permanent basis. Memory 22 and storage 24 may include a subscriber identification module (SIM) card and reader.

Storage components 24 may store information, instructions, and/or software related to the operation of the system 100 or 200 and computing resources. Storage 24 may be used to store operating system, executables, data, applications, and the like, and may include fast access primary storage, as well as slower access secondary storage, which may be virtual or fixed.

Storage component(s) 24 may include one or more transitory and/or non-transitory computer-readable media that store or otherwise embody software implementing particular embodiments. The computer-readable medium may be any tangible medium capable of carrying, communicating, containing, holding, maintaining, propagating, retaining, storing, transmitting, transporting, or otherwise embodying software, where appropriate, including nano-scale medium. The computer-readable medium may be a biological, chemical, electronic, electromagnetic, infrared, magnetic, optical, quantum, or other suitable medium or a combination of two or more such media, where appropriate. Example computer-readable media include, but are not limited to fixed and removable drives, application-specific integrated circuits (ASICs), CDs, DVDs, field-programmable gate arrays (FPGAs), floppy disks, optical and magneto-optic disks, hard disks, holographic storage apparatuses, magnetic tape, caches, programmable logic apparatuses (PLDs), random-access memory (RAM) apparatuses, read-only memory (ROM) apparatuses, semiconductor memory apparatuses, solid state drives, cartridges, and other suitable computer-readable media.

Input components 26 and output components 28 may include various types of input/output (I/O) apparatuses and ports. The I/O apparatuses may include a graphical user interface (GUI) that provides an easy to use visual interface between the user and system 100 or 200 and access to the operating system or application(s) running on the apparatuses.

Input components 26 receive any type of input in various forms from users or other machines, such as touch screen and video displays, keyboards, keypads, mice, buttons, track balls, switches, joy sticks, directional pads, microphones, cameras, transducers, card readers, voice and handwriting inputs, and sensors for sensing information such as temperature, location via global positioning system (GPS) or otherwise, accelerometer, gyroscope, actuator data, which may be input via a component in the user apparatus 12 and/or received via one or more communication interfaces 30.

Output component 28 may include displays, speakers, lights, sensor information. Similar to the input, the output may be provided via one or more ports and/or one or more communication interfaces 30.

Communication interface 30 may include one or more transceivers, receivers, transmitters, modulators, demodulators that enable communication with other apparatuses, via wired and/or wireless connections. Communication interface 30 may include Ethernet, optical, coaxial, universal serial bus (USB), infrared, radio frequency (RF) including the various Wi-Fi, WiMax, cellular, and Bluetooth protocols, such as Bluetooth, Bluetooth Low Energy (BLE), Near-field Communications, Wi-Fi (IEEE 802.11), Wi-Fi Direct, SuperWiFi, 802.15.4, WiMax, LTE systems, LTE Direct, past, current, and future cellular standard protocols, e.g., 4-5G, or other wireless signal protocols or technologies as described herein and known in the art.

The foregoing disclosure provides examples, illustrations and descriptions of the present invention, but is not intended to be exhaustive or to limit the implementations to the precise form disclosed. Modifications and variations are possible in light of the above disclosure or may be acquired from practice of the implementations. These and other variations and modifications of the present invention are possible and contemplated, and it is intended that the foregoing specification and the following claims cover such modifications and variations.

As used herein, the term component is intended to be broadly construed as hardware and software, and/or a combination of hardware and software, including firmware, etc. It will also be apparent that systems and/or methods, described herein, may be implemented in different forms of hardware and software, or combinations thereof. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Hardware processor modules may range, for example, from general-purpose processors to field programmable gate arrays (FPGA) to an application specific integrated circuits (ASIC), and combinations thereof. Software modules (executed on hardware) may be expressed in a variety of software languages (e.g., computer code), including C, C++, Java, Javascript, Rust, Go, Scala, Ruby, Visual Basic, FORTRAN, Haskell, Erlang, and/or other object-oriented, procedural, or other programming language and development tools. Computer code may include micro-code or micro-instructions, machine instructions, such as produced by a compiler, code used to produce a web service, and files containing higher-level instructions that are executed by a computer using an interpreter and employ control signals, encrypted code, and compressed code.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of an apparatus that provides the user interface for display. In some implementations, a user interface may be configurable by an apparatus and/or a user (e.g., a user may change the size of the user interface, information provided via the user interface, a position of information provided via the user interface, etc.). Additionally, or alternatively, a user interface may be pre-configured to a standard configuration, a specific configuration based on a type of apparatus on which the user interface is displayed, and/or a set of configurations based on capabilities and/or specifications associated with an apparatus on which the user interface is displayed.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An apparatus for supporting handheld electronics including a screen side and a backside opposite to the screen side, the apparatus comprising:
    a base;
    an electronics retaining portion (ERP) having a retention plane to retain
        the electronics without substantially covering the screen side and with the screen side in the retention plane, and
        the base between the ERP and the back side;
    a contoured handle attached to the base and extending through the ERP,
        the contoured handle having a shape defining a gripping plane substantially parallel to the retention plane; and
    a rechargeable battery retained in at least one of the handle and the base to allow charging of at least the handheld electronics from the battery and recharging of the battery.

2. The apparatus of claim 1, where at least the contoured handle rotates relative to the ERP, when the base, ERP, and handle are connected.

3. The apparatus of claim 1, where the contoured handle and base rotate relative to the ERP.

4. The apparatus of claim 1, where the ERP removability retains the electronics.

5. The apparatus of claim 1, further comprising a rotational position indicator lid attached to the backside and engaging the base to prevent free rotation of the base and contoured handle relative to the ERP.

6. The apparatus of claim 1, where the base includes an electronics module having input or output access through the ERP.

7. The apparatus of claim 1, where the contoured handle includes an electronics module having input or output access.

8. The apparatus of claim 7, where the battery is part of an electronics module includes at least one of a display, communication input port, communication output port, power input port, wireless communications, speakers, microphone, card reader, memory, one or more processors, and biometric sensors.

9. The apparatus of claim 1, where the contoured handle includes at least one support surface to support the apparatus and the handheld electronics.

10. The apparatus of claim 1, where the contoured handle is ergonomically shaped to a gripping hand.

11. The apparatus of claim 1, further comprising a rotational lid indicator engaging the back side of the handheld electronics and the base,
the base to rotate relative the rotational lid indicator and the electronics.

12. The apparatus of claim 11, where the rotational lid indicator and base have cooperating surfaces that impede rotation.

13. The apparatus of claim 1, where the contoured handle includes a support surface to provide free standing support to the screen side at a non-zero angle relative to the support surface.

14. An apparatus for supporting a tablet computer comprising:
an electronics retaining portion (ERP) having a tablet retention plane to retain a tablet computer having a screen side and a backside opposite to the screen side without substantially covering the screen side and with the screen side in the tablet retention plane;
a contoured handle attached to and cooperating with the ERP,
the contoured handle having a shape defining a gripping plane substantially parallel to the tablet retention plane, the handle being rotatable relative to the ERP when connected to the ERP; and
a rechargeable battery retained in the handle to allow charging of at least the tablet from the battery and recharging of the battery.

15. The apparatus of claim 14, where the battery is part of an electronics module includes at least one of a display, communication input port, communication output port, power input port, wireless communications, speakers, microphone, card reader, memory, one or more processors, and biometric sensors.

16. The apparatus of claim 14, where
the contoured handle is shaped to support the ERP standing on at least one edge of the ERP.

17. The apparatus of claim 14, where
the contoured handle is shaped to seat in a tablet stand-alone base.

18. The apparatus of claim 14, where
the battery is part of electronics module to provide input and output communications access to the tablet.

19. The apparatus of claim 14, further comprising:
a base attached to the ERP and the handle, the handle being rotatable relative to the base and ERP, when the base, ERP, and handle are attached.

20. The apparatus of claim 14, where
a base connecting to the ERP and the handle, the base and handle being rotatable relative to the base and ERP, when the base, ERP, and handle are attached.

\* \* \* \* \*